US009835653B2

(12) United States Patent
Audette et al.

(10) Patent No.: US 9,835,653 B2
(45) Date of Patent: Dec. 5, 2017

(54) SOLDER BUMP ARRAY PROBE TIP STRUCTURE FOR LASER CLEANING

(71) Applicant: International Business Machines Corporation, Armonk, NY (US)

(72) Inventors: David M. Audette, Colchester, VT (US); Dennis M. Bronson, Jr., Milton, VT (US); Joseph K. V. Comeau, Alburgh, VT (US); Dustin M. Fregeau, South Burlington, VT (US); David L. Gardell, Fairfax, VT (US); Frederick H. Roy, III, Burlington, VT (US); James R. Salimeno, III, Fairfax, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 14/276,223

(22) Filed: May 13, 2014

(65) Prior Publication Data

US 2015/0331014 A1    Nov. 19, 2015

(51) Int. Cl.
*G01R 3/00* (2006.01)
*G01R 1/073* (2006.01)
*G01R 31/28* (2006.01)
*G01R 1/067* (2006.01)

(52) U.S. Cl.
CPC ........... *G01R 3/00* (2013.01); *G01R 1/06738* (2013.01); *G01R 1/07314* (2013.01); *G01R 1/07342* (2013.01); *G01R 31/2886* (2013.01)

(58) Field of Classification Search
CPC .................. G01R 31/2886; G01R 1/07314

USPC .......................................................... 324/755
See application file for complete search history.

(56) References Cited

U.S. PATENT DOCUMENTS

| 5,666,063 | A | | 9/1997 | Abercrombie et al. |
| 5,998,986 | A | | 12/1999 | Ido |
| 6,143,401 | A | * | 11/2000 | Fischer ............... H01L 21/4857 174/255 |
| 6,198,300 | B1 | * | 3/2001 | Doezema ............... B82Y 35/00 324/755.07 |
| 6,573,702 | B2 | | 6/2003 | Marcuse et al. |
| 7,075,323 | B2 | | 7/2006 | Brunner et al. |
| 7,112,974 | B1 | | 9/2006 | Jin et al. |
| 7,182,672 | B2 | | 2/2007 | Tunaboylu et al. |
| 7,212,019 | B2 | | 5/2007 | Schneegans et al. |
| 8,054,095 | B2 | | 11/2011 | Hougham et al. |

(Continued)

FOREIGN PATENT DOCUMENTS

| EP | 0820097 A1 | 1/1998 |
| EP | 1189016 B1 | 4/2009 |

(Continued)

*Primary Examiner* — Tung X Nguyen
*Assistant Examiner* — Akm Zakaria
(74) *Attorney, Agent, or Firm* — Steven J. Meyers; Hoffman Warnick LLC

(57) ABSTRACT

A probe tip structure that decreases the accumulation rate of Sn particles to the probe tip and enables considerably more efficient and complete laser cleaning is disclosed. In an embodiment, the probe structure includes an array of probe tips, each probe tip having an inner core; an interfacial layer bonded to the inner core; and an outer layer bonded to the interfacial layer, wherein the outer layer is resistant to adherence of the solder of the ball grid array package.

13 Claims, 7 Drawing Sheets

(56) References Cited

U.S. PATENT DOCUMENTS

| | | | |
|---|---|---|---|
| 2002/0000815 A1* | 1/2002 | Fjelstad | G01R 1/07314 |
| | | | 324/754.07 |
| 2003/0034782 A1* | 2/2003 | Hirano | G01R 1/07307 |
| | | | 324/500 |
| 2009/0133171 A1* | 5/2009 | Jin | B82Y 15/00 |
| | | | 850/60 |
| 2010/0014073 A1* | 1/2010 | Hashiguchi | B82Y 20/00 |
| | | | 356/128 |
| 2010/0038560 A1 | 2/2010 | Tokura et al. | |
| 2015/0108002 A1* | 4/2015 | Kim | C25D 1/003 |
| | | | 205/122 |

FOREIGN PATENT DOCUMENTS

| | | |
|---|---|---|
| GB | 2145523 A | 3/1985 |
| JP | 04354144 A | 12/1992 |
| JP | 04351968 A | 12/1993 |

* cited by examiner

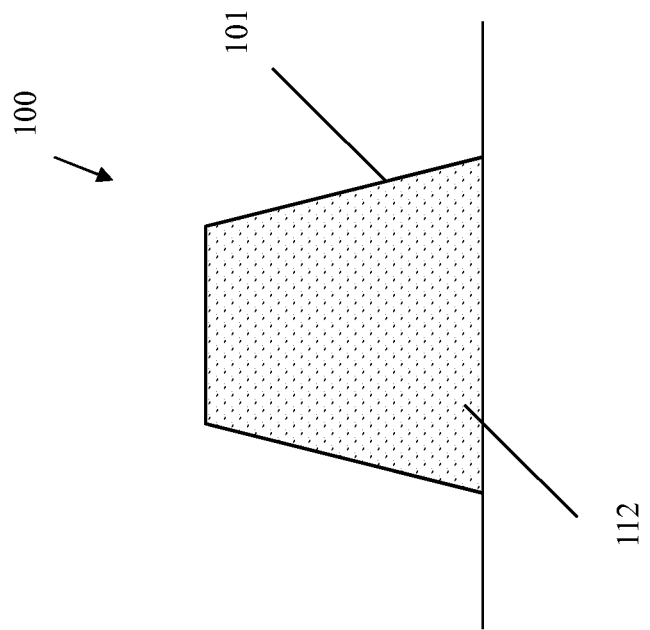
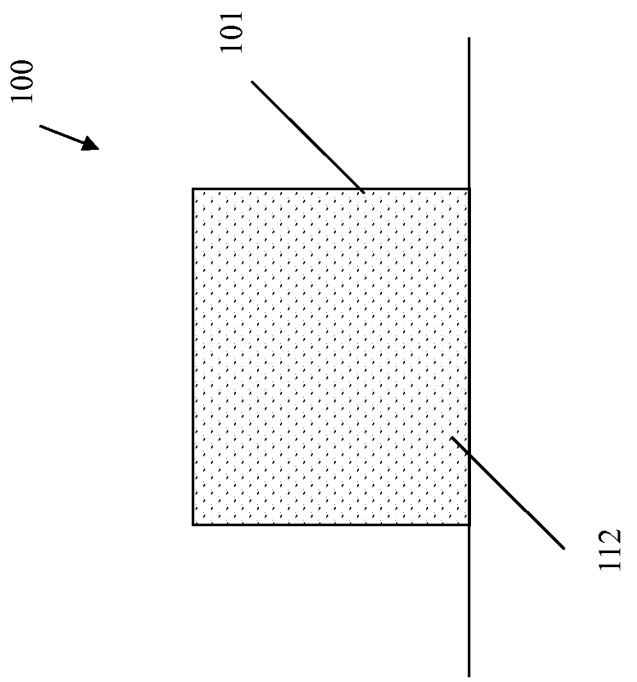

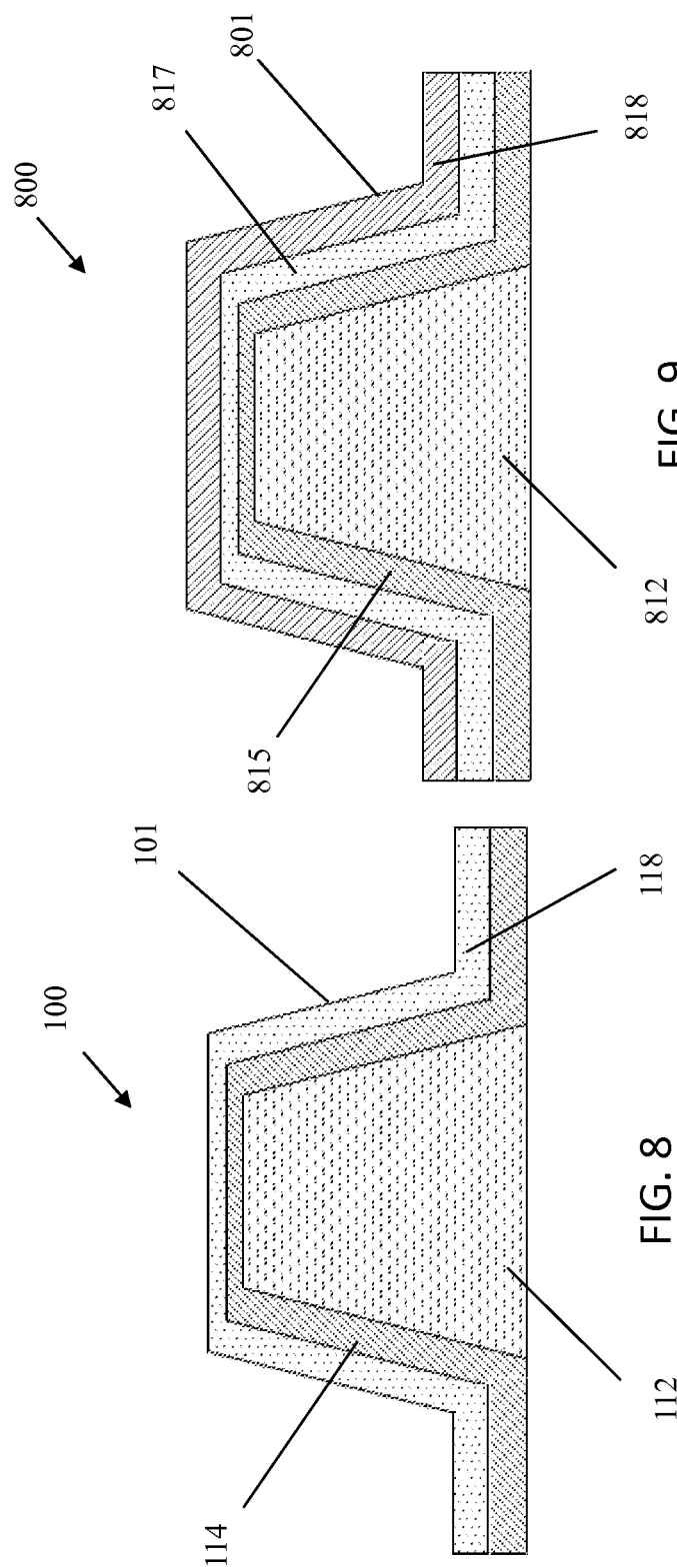

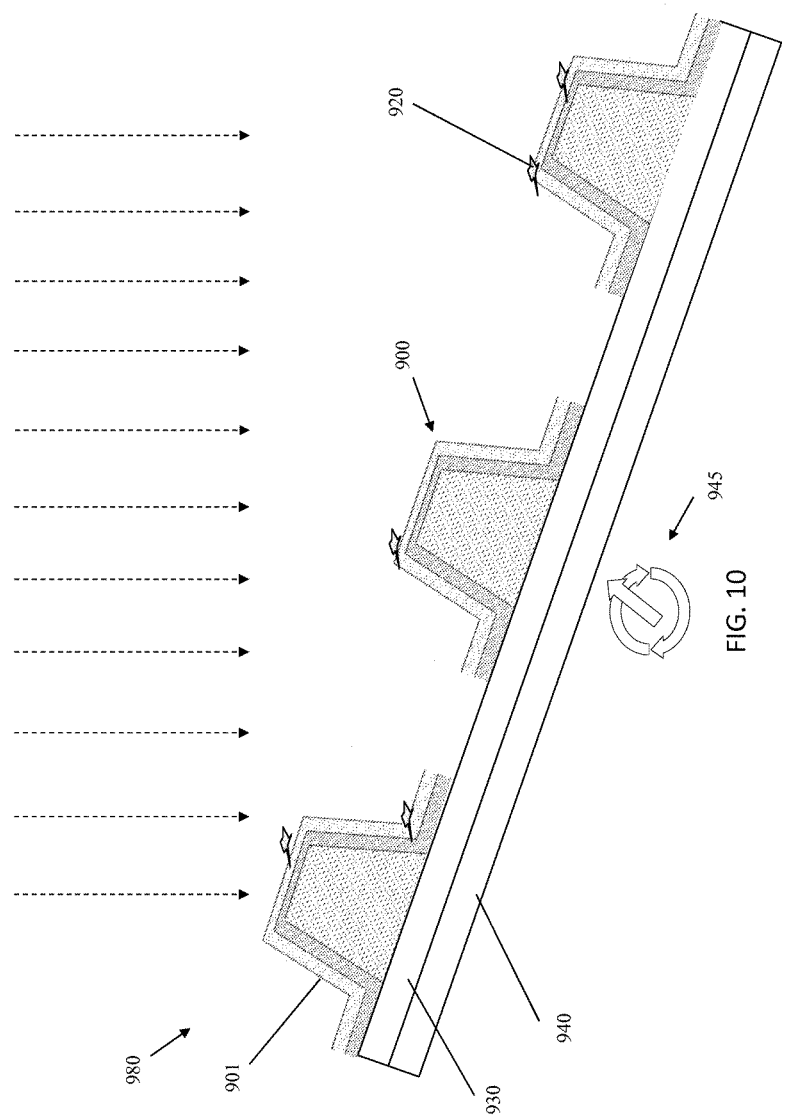

SOLDER BUMP ARRAY PROBE TIP STRUCTURE FOR LASER CLEANING

BACKGROUND OF THE INVENTION

Embodiments of the invention relate generally to integrated circuit (IC) devices. More particularly, the subject matter disclosed herein relates to a probe tip structure for testing an array of solder bumps of an integrated circuit and for testing an integrated circuit.

Testing products with very large arrays of solder bumps require probes that are durable, accurate and reliable. Achieving good (low resistance, repeatable) electrical probe contact with a solder bump requires some degree of penetration of the bump by the probe tip in order to bypass any surface oxide. As shown in FIG. 1, the present state of art is to force rigid cylindrical probe tips 10 deposited on a ceramic or organic substrate (not shown) into the surface of tin (Sn) solder bumps 15. The cylinders are generally formed from copper (Cu) electroplating through a resist mask, after which the resist is stripped, and nickel (Ni) and gold (Au) layers are plated over the Cu.

An array of probe tips cannot be made to be perfectly planar and parallel to the solder bumps on the device to be tested. One common way to overcome this challenge is to have some compliance built into the design of the probe. Examples of compliant probes are cantilever, cobra, buckling beam as well as some membrane or elastomeric probes. However, compliant probes take up too much space due to their spring structure. Additionally, compliant probes are more expensive and complex, and also have limited current carrying capability.

Rigid probes such as thin film interposer (TFI) and probe on substrate (POS) were developed to enable testing of high power products that have a large number of closely spaced solder balls. Rigid probes overcome planarity variations by using a high force to deform the highest solder bumps enough so all bumps make electrical contact. The amount of force required can be controlled by making the probe tips smaller in diameter, minimizing the hardness of the solder bumps and improving control of solder bump and probe tip planarity. In other words, a rigid probe structure relies on compliance of the solder bumps themselves.

Referring back to FIG. 1, a problem with probe tips 10 of the present state of art is that after testing several wafers, the contact resistance begins to rise, eventually obscuring some of the desired test results. Contact resistance rises partially due to the accumulation and oxidation of Sn particles 20 which cling to probe tips 10 and decrease the surface of the probe tips 10 that contacts the solder. To restore probe tip 10 to its original low contact resistance value, probe tip 10 is subjected to a chemical cleaning process to remove Sn particles 20. Unfortunately, this procedure is lengthy and can damage probe tip 10 or other parts of the assembly such as the substrate. The process also uses dangerous chemicals.

In order to increase efficiency and safety, a laser cleaning process was introduced to ablate Sn particles 20 from probe tips 10. This process is relatively fast and does not cause damage to probe tip 10. However, the results of the laser cleaning process are not as good as the chemical clean. Consequently, laser cleaned probes need to be cleaned more often than chemically cleaned probes. During the laser clean, the temperature of the probe tip 10 can exceed the melting point of Sn, such that the Au and Sn form alloys at relatively low temperatures. While the Sn melting temperature is much lower than that of Au or Cu, by the time enough energy is applied to evaporate the Sn particles 20, there is sufficient energy to alloy the Sn and the Au or Cu. In some cases, these alloys can cause the Sn particles 20 to become more firmly attached to the Au or Cu. These residual Sn particles 20 accrue additional particles more easily than a clean surface and shorten the time between cleanings.

SUMMARY OF THE INVENTION

Various embodiments include a probe tip structure that decreases the accumulation rate of Sn particles to the probe tip structure and enable considerably more efficient and complete laser cleaning.

In one embodiment, a probe tip structure for a test application of solder on a ball grid array package is provided. The probe tip structure comprises an array of probe tips, each probe tip having an inner core; an interfacial layer bonded to the inner core; and an outer layer bonded to the interfacial layer, wherein the outer layer is resistant to adherence of the solder of a ball grid array package.

In another embodiment, a solder bump array probe is provided. The solder bump array probe comprises a substrate; an array of probe tips directly on the substrate, the probe tips having an inner core; an interfacial layer bonded to the inner core; and an outer layer bonded to the interfacial layer, wherein the outer layer is resistant to adherence of a solder; wherein the inner core of the probe tips comprises a layer of high conductivity metal; and wherein the outer layer comprises a material with a higher melting point than that of the inner core.

Another embodiment of the invention provides for a rigid probe structure. The rigid probe structure comprises an array of probe tips disposed on a rigid substrate, each probe tip having an inner core; an interfacial layer bonded to the inner core; and an outer layer bonded to the interfacial layer, wherein the outer layer is resistant to adherence of solder of a ball grid array package; and wherein the substrate is mounted to a turn table; and wherein the turn table is inclined at an angle to an incident laser and the turn table is rotatable about a perpendicular axis of the substrate.

BRIEF DESCRIPTION OF SEVERAL VIEWS OF THE DRAWINGS

These and other features of this invention will be more readily understood from the following detailed description of the various aspects of the invention taken in conjunction with the accompanying drawings that depict various embodiments of the invention, in which:

FIG. 2 shows a cross-sectional depiction of an inner core in cylindrical form in accordance with embodiments of the invention.

FIG. 3 shows a cross-sectional depiction of an inner core having tapered side walls after undergoing an etching process.

FIG. 8 shows a cross-sectional depiction of an inner core and interfacial layer after deposition of an outer layer.

FIG. 9 shows a cross-sectional depiction of another embodiment of the invention with an inner core, first interfacial layer, second interfacial layer, and outer layer.

FIG. 10 shows a cross-sectional depiction of a portion of an embodiment of the invention mounted on a turn table exposed to a laser.

DETAILED DESCRIPTION OF THE INVENTION

Figure 1:
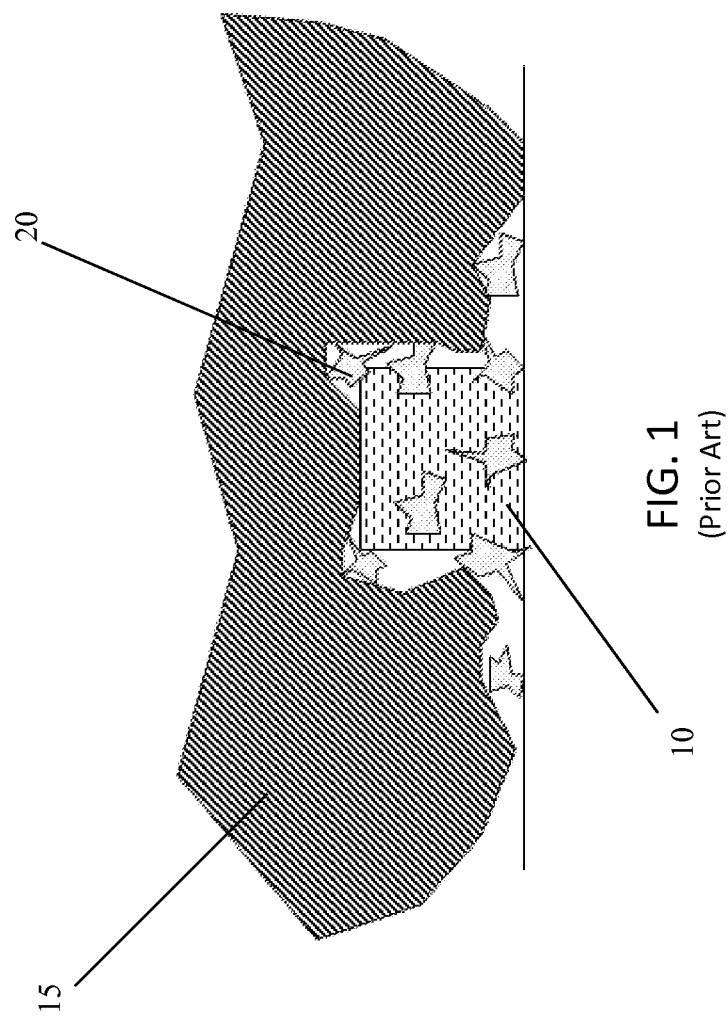
FIG. 1 shows a cross-sectional depiction of the prior art.

As indicated above, the subject matter disclosed herein relates to integrated circuit (IC) devices. More particularly, the subject matter disclosed herein relates to a probe tip structure for testing an array of solder bumps of an integrated circuit and for testing an integrated circuit.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

The rigid probe tip structure disclosed herein decreases the accumulation rate of solder particles on the probe tip. Conventional cylindrical probe tips have sharp corners which are the primary sites for solder particle retention after repeatedly inserting and withdrawing the probe tips from solder bumps. Etching removes the sharp corners of conventional probe tips, and the resulting shape resists the adherence of solder particles. Thus, the surface area that may contact the solder bump may increase with the decrease of solder particle adherence. This allows the passage of more time between probe cleanings, and improves the overall life and efficiency of the probe tip.

FIG. 8 shows one embodiment of the invention wherein a rigid probe tip 100 has tapered side walls 101. As will be described in detail, probe tip 100 may include an inner core 112, an interfacial layer 114, and an outer layer 118. It is to be understood that FIGS. 2-9 show a single probe tip for ease of understanding. However, the probe tip structure may comprise an array of probe tips.

Referring now to FIGS. 2-7, various embodiments of inner core 112 according to embodiments of the invention will now be described. FIG. 2 shows a cross-sectional view of one embodiment of inner core 112. Inner core 112 may comprise a layer of high conductivity metal, for example, Cu. Inner core 112 may be created using well known photolithography processes. For example, a photo resist may be applied to the substrate, and then exposed and etched to create holes into which copper is deposited, the excess copper and resist is subsequently stripped off leaving the substantially cylindrical copper posts of FIG. 2. The substantially cylindrical posts of FIG. 2 may then be further modified with additional etching and perhaps mask steps to produce the embodiments shown in FIGS. 3, 4, 5 and 6.

"Etching" generally refers to the removal of material from a substrate (or structures formed on the substrate), and is often performed with a mask in place so that material may be selectively removed from certain areas of the substrate, while leaving the material unaffected in other areas of the substrate. Etching may include any now known or later developed techniques appropriate for the material to be etched including but not limited to, for example: isotropic etching, anisotropic etching, plasma etching, sputter etching, ion beam etching, reactive-ion beam etching and reactive-ion etching (RIE). Etching may also be accomplished with mechanical abrasion of the probe tip for example with abrasive loaded elastomers.

Figure 5:
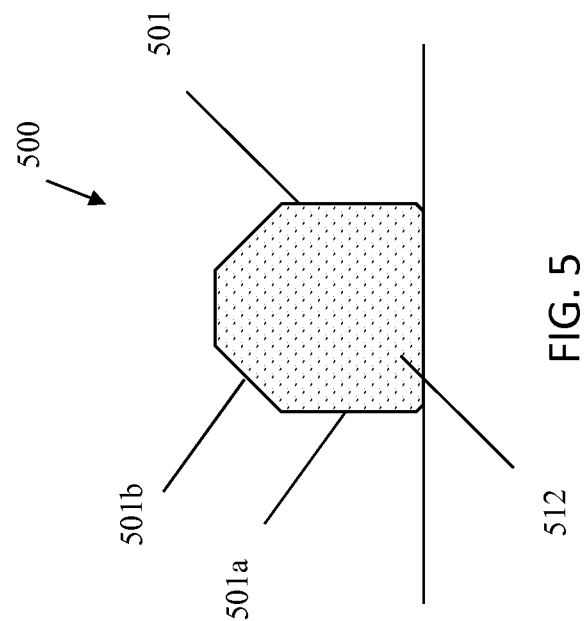
FIG. 5 shows a cross-sectional depiction of an inner core having side walls with a substantially cylindrical bottom and a tapered top.
Figure 4:
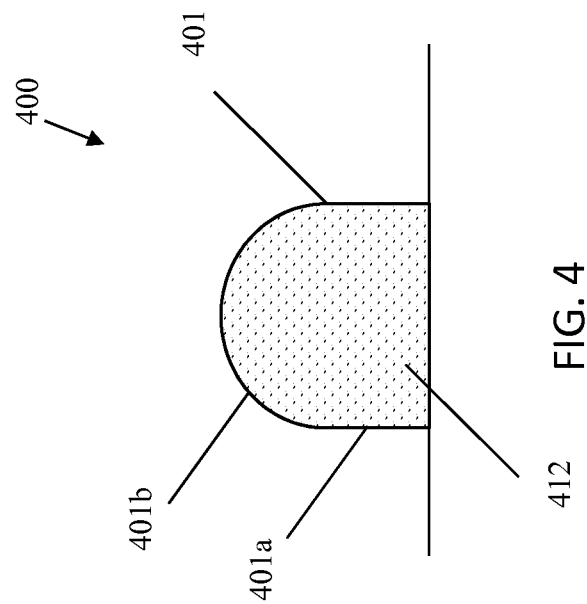
FIG. 4 shows a cross-sectional depiction of an inner core having side walls with a substantially cylindrical bottom and substantially hemispherically shaped top.

Etching inner core 112 as described above removes the upper corners of the cylinder where solder particles are most likely retained. Inner core 112 may be etched such that inner core 112 may be shaped in any of the embodiments shown in FIGS. 3-6. FIG. 3 shows inner core 112 with tapered side walls 101. FIG. 4 shows inner core 412 with side walls 401 that have a substantially cylindrical bottom 401a with a substantially hemispherically shaped top 401b. FIG. 5 shows inner core 512 with a shape that has a substantially cylindrical bottom 501a with a tapered top 501b, such that a portion of probe tip 500 has substantially vertical side walls 501.

Figure 6:
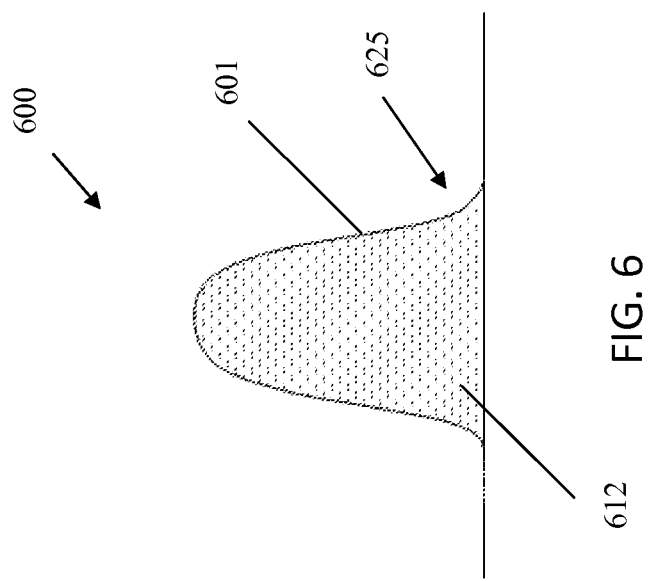
FIG. 6 shows a cross-sectional depiction of an inner core with bell-curve shaped side walls.

FIG. 6 shows a probe tip 600 that is substantially bell curve shaped. In this embodiment, inner core 612 has undergone a heavier etch such that more of inner core 612 is removed, providing a probe tip 600 that is thinner than the other embodiments shown in FIGS. 3-5. FIG. 6 also shows probe tip 600 wherein side walls 601 meet the bottom of probe tip 600 at a slant 625 such that the lower corners of the Cu cylinder are also removed. Slant 625 prevents solder particles 920 (shown in FIG. 10) from becoming lodged in the lower corners. It is understood that the lower corners of the Cu cylinder of the embodiments of FIGS. 3-5 may also be removed during the etching process such that each of the embodiments have slants 625.

The shape of the probe tips can be optimized based on the type of product tested. For example, a large high power chip with a solder bump of low elasticity may have a probe tip with more vertical sides, such as probe tip as shown in FIG. 5, to maintain contact with the solder bump during small thermally induced deformations. A chip with lower power, or more elastic solder bumps may be tested with probes that have more sloping sides so the probes do not need to be cleaned as often, such as probe tip as shown in FIGS. 3, 4, and 6. It is also understood that embodiments of the present invention are not limited to the geometries shown in FIGS. 3-6 and may be of other shapes that accomplish the same advantages.

Figure 7:
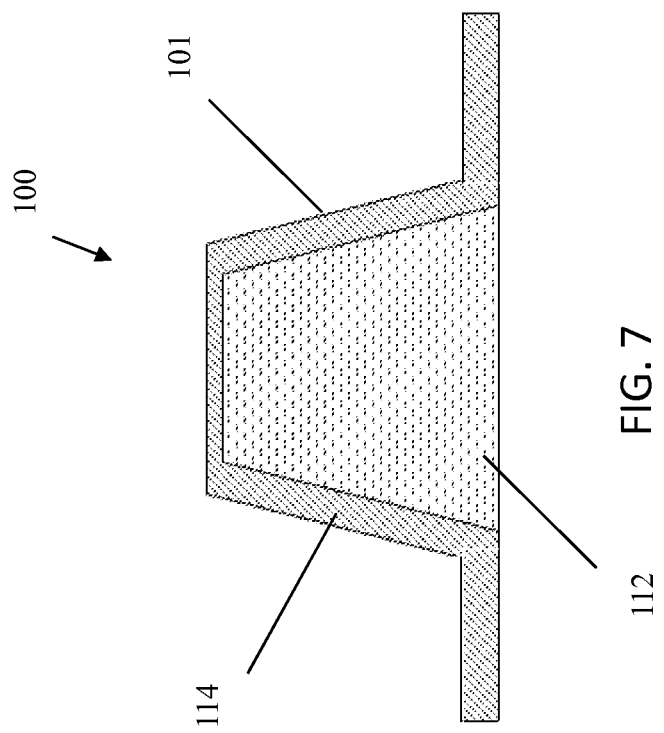
FIG. 7 shows a cross-sectional depiction of an inner core after deposition of an interfacial layer.

Referring now to FIGS. 7-10, subsequent processing of a probe tip will now be described. While FIGS. 7-10 refer to only inner core 112 as illustrated in FIG. 3, it is understood that the teachings are applicable to any embodiment of inner core from FIGS. 2-6. As shown in FIG. 7, once inner core 112 has been etched to a desired shape, interfacial layer 114 may be deposited over inner core 112 such that it is bonded mechanically and electrically to inner core 112. Interfacial layer 114 may include, but is not limited to, nickel (Ni), titanium (Ti), and/or tantalum (Ta). As described herein, "deposition" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDCVD), rapid thermal CVD (RTCVD), ultra-high vacuum CVD (UH-CVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), electroplating and electroless-plating, and evaporation.

As shown in FIG. 8, outer layer 118 may be deposited on interfacial layer 114 such that it is bonded mechanically and electrically to interfacial layer 114. Outer layer 118 may be deposited using any appropriate deposition techniques as listed herein. Outer layer 118 may include, but is not limited to, molybdenum (Mo), titanium nitride (TiN), and/or tantalum nitride (TaN). For example, inner core 112 may include Cu, interfacial layer 114 may include Ni, and outer layer 118 may include Mo. In another example, inner core 112 may include Cu, interfacial layer 114 may include Ta, and outer layer 118 may include TaN.

With regard to the deposition materials chosen for the present application, outer layer 118 has a melting point much higher than that of Sn. If the melting point of outer layer 118 is relatively close to that of Sn, then there is a possibility that part of probe tip 100 will be evaporated if enough energy is provided on the tip to evaporate the Sn. Therefore, outer layer 118 may have a melting point six to ten times higher than that of Sn so that outer layer 118 will not be damaged by the laser energy sufficient to vaporize Sn. Additionally, outer layer 118 has a lower thermal conductivity which causes the heat generated by the laser to be contained more closely to the surface where solder particles 920 (shown in FIG. 10) are located. This prevents alloying of the Sn particles to the layers 112, 114, 118.

Interfacial layer 114 and outer layer 118 may be deposited such that the coating is thick enough (100 to 30,000 Angstroms) that it achieves good coverage over inner core 112, and so that the heat penetration from the laser does not diffuse into inner core 112. Additionally, etching inner core 112 before depositing interfacial layer 114 and outer layer 118 allows probe tip 100 to more readily accept deposited materials thereon. For example, with respect to cylindrical probes, it is more difficult to coat the vertical side walls with other materials by some types of deposition.

Interfacial layer 114 and outer layer 118 need to bond to inner core 112. Therefore, there may be some alloying between probe tip layers 112, 114, 118 themselves. For example, in the case where outer layer 118 includes TaN, TaN does not bond very well to an inner layer 112 of Cu, thus an interfacial layer 114 of Ta may be used. Ta bonds well to both Cu and TaN. This same principle applies in the case where interfacial layer 114 includes Ni and outer layer 118 includes Mo. Thus, the constitution of interfacial layer 114 may be selected by both the materials used for inner core 112 and outer layer 118.

Referring now to FIG. 9, another embodiment of the invention is shown wherein interfacial layer 114 of FIG. 8 further comprises a first interfacial layer 815 and a second interfacial layer 817. An outer layer 818 is positioned over second interfacial layer 817. In this embodiment, an inner core 812 (similar to inner core 112) may include Cu, first interfacial layer 815 may include Ni, second interfacial layer 817 may include Ti, and outer layer 818 may include TiN. In this embodiment, first interfacial layer 815 acts as a barrier between inner core 812 and second interfacial layer 817 because Ti diffuses easily with Cu. Again, it is to be understood that first and second interfacial layer 815, 817 are not limited to include only Ti and TiN, but instead are determined by both the materials used for inner core 812 and outer layer 818. For example, other materials may include, but are not limited to, Rhodium (Rh), Rhenium (Re), Rhenium Diboride ($ReB_2$), and Iridium (Ir).

FIG. 10 shows a portion of an embodiment of the invention wherein the probe tip structure 980 has an array of probe tips 900 having solder particles 920 are subjected to laser cleaning. The array of probe tips 900 may be deposited on a rigid ceramic or organic substrate 930. The embodiment of FIG. 10 is shown with the array of probe tips 900 having tapered side walls 901, however, it is understood that the following discussion also applies to any of the other embodiments and geometries as shown in FIGS. 3-6. As probe tip structure 980 is exposed to a laser (shown by the dotted arrows), tapered side walls 901 of probe tips 900 will absorb more laser energy than probes with more vertical sides; however some of the laser energy will be reflected from the tapered sides.

The amount of laser energy absorbed by a surface will depend on several factors including the angle of the surface with respect to the laser energy. A vertical laser will heat up horizontal surfaces much more than vertical surfaces. Laser cleaning will be more effective on probes with sloping sides. The sides of probes can be more effectively cleaned by temporarily mounting the substrate 930 to a turntable 940 during laser cleaning. Turntable may be inclined at an angle to the laser power and rotated during cleaning, so that all surfaces will receive enough energy to clean contamination off the surfaces. For example, turntable 940 may be inclined at an angle of 25-75 degrees. The turn table 940 may also rotate about an axis that is perpendicular to substrate 930, as indicated by arrows 945, so that all sides of the probes may get cleaned.

Figure 11:
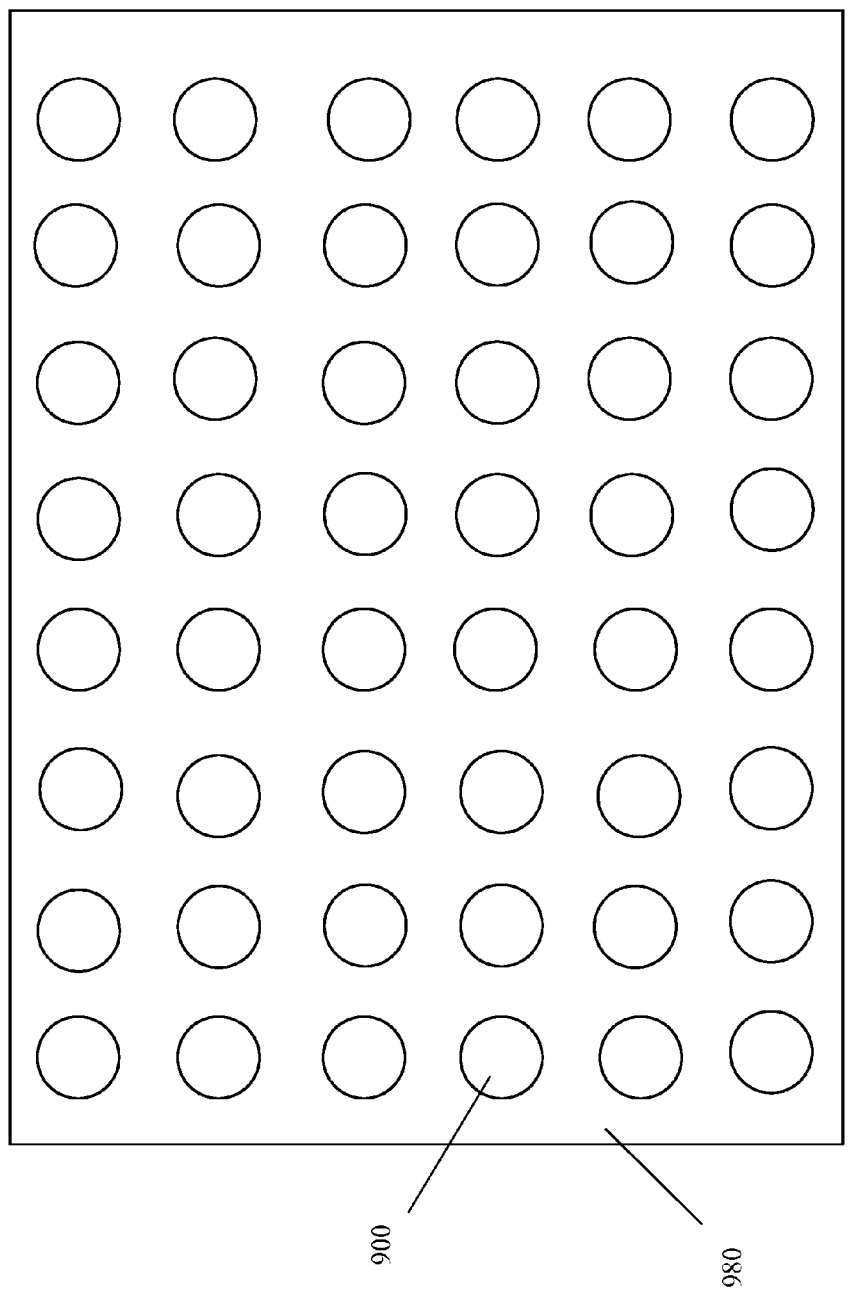
FIG. 11 shows a perspective view of a probe tip structure having an array of probe tips according to embodiments of the invention It is noted that the drawings of the invention are not necessarily to scale. The drawings are intended to depict only typical aspects of the invention, and therefore should not be considered as limiting the scope of the invention. In the drawings, like numbering represents like elements between the drawings.

Referring now to FIG. 11, the probe tip structure 980 having an array of probe tips 900 is shown for testing an array of solder bumps (not shown) wherein each probe tip 900 tests a solder bump. Generally, an array of probes may require between 2,000 and 20,000 probes. However, in other aspect, an array may require over 150,000 probes. Each probe tip 900 may include any of the probe tips described above.

Spatially relative terms, such as "inner," "outer," and the like, may be used herein for each of description to describe one element or features relationship to another element(s) or feature(s) as illustrated in the figures. Spatially relative terms may be intended to encompass different orientations of the device in use or operation in addition to the orientation depicted in the figures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand embodiments disclosed herein.

What is claimed is:

1. A rigid probe tip structure for a test application of solder on a ball grid array package, the rigid probe tip structure comprising:
   an array of probe tips, each probe tip having an inner core including a high conductivity metal;

an interfacial layer, wherein the interfacial layer includes Ta, bonded to the inner core, wherein the interfacial layer comprises a first interfacial layer and a second interfacial layer over the first interfacial layer; and an outer layer, wherein the outer layer includes TaN, bonded to the second interfacial layer, wherein the outer layer has a melting point higher than a melting point of the inner core.

2. The rigid probe tip structure of claim 1, wherein the high conductivity metal includes Cu.

3. The rigid probe structure of claim 1, wherein the melting point of the outer layer is six to ten times higher than the melting point of the solder.

4. The rigid probe tip structure of claim 1, wherein the interfacial layer includes Ni.

5. The rigid probe tip structure of claim 1, wherein the probe tips have tapered side walls.

6. A rigid solder bump array probe comprising:
a substrate;
an array of probe tips directly on a substrate, the probe tips having an inner core;
an interfacial layer bonded to the inner core, wherein the interfacial layer includes Ta and comprises a first interfacial layer and a second interfacial layer over the first interfacial layer; and
an outer layer bonded to the second interfacial layer, wherein the outer layer comprises TaN, and is resistant to adherence of a solder; and wherein the inner core further comprises a layer of high conductivity metal; and wherein the outer layer comprises a material with a higher melting point than that of the inner core.

7. The rigid solder bump array probe of claim 6, wherein the interfacial layer includes Ni.

8. The rigid solder bump array probe of claim 6, wherein the substrate is mounted to a turn table, the turn table being inclined at an angle to an incident laser.

9. The rigid solder bump array probe of claim 8, wherein the turn table is inclined at an angle of 45 degrees.

10. A rigid probe structure comprising:
an array of probe tips disposed on a rigid substrate, each probe tip having an inner core including a high conductivity metal;
an interfacial layer bonded to the inner core, wherein the interfacial layer includes Ta and further comprises a first interfacial layer and a second interfacial layer over the first interfacial layer; and
an outer layer comprising TaN bonded to the second interfacial layer, wherein the outer layer has a melting point higher than a melting point of the inner core, and is resistant to adherence of solder of a ball grid array package; and wherein the substrate is temporarily mounted on a turn table; and wherein the turn table is inclined at an angle to an incident laser and the turn table is configured to rotate about a perpendicular axis of the substrate.

11. The rigid solder bump array probe of claim 6, wherein the melting point of the outer layer is six to ten times higher than the melting point of a solder bump.

12. The rigid solder bump array probe tip structure of claim 6, wherein each probe tip in the array of probe tips is substantially bell curve shaped, wherein sidewalls of each probe tip include a slanted surface where each probe tip meets the substrate.

13. The rigid solder bump array probe tip structure of claim 6, wherein each probe tip in the array of probe tips includes a cylindrically-shaped lower portion and a hemispherically-shaped upper portion.

* * * * *